(12) United States Patent
Wu et al.

(10) Patent No.: US 9,915,519 B2
(45) Date of Patent: Mar. 13, 2018

(54) MEASURING SYSTEM AND MEASURING METHOD

(71) Applicant: Semiconductor Manufacturing International (Shanghai) Corporation, Shanghai (CN)

(72) Inventors: Qiang Wu, Shanghai (CN); Yuntao Jiang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/190,182

(22) Filed: Jun. 23, 2016

(65) Prior Publication Data

US 2017/0370698 A1 Dec. 28, 2017

(51) Int. Cl.
| | | |
|---|---|---|
| G01B 9/02 | (2006.01) | |
| G02B 27/14 | (2006.01) | |
| G02B 27/00 | (2006.01) | |
| G02B 5/00 | (2006.01) | |
| G01B 11/27 | (2006.01) | |

(52) U.S. Cl.
CPC ........ *G01B 9/02056* (2013.01); *G01B 11/272* (2013.01); *G02B 5/005* (2013.01); *G02B 27/0025* (2013.01); *G02B 27/144* (2013.01)

(58) Field of Classification Search
CPC .. G01B 9/02042; G01B 9/0209; G01B 11/24; G01B 11/2441
See application file for complete search history.

(56) References Cited

U.S. PATENT DOCUMENTS

| 5,739,912 A | * | 4/1998 | Ishii | G01B 11/24 219/124.34 |
| 2004/0179202 A1 | * | 9/2004 | Sezginer | G01J 3/453 356/451 |
| 2011/0032535 A1 | * | 2/2011 | Liesener | G03F 7/70633 356/511 |
| 2012/0224183 A1 | * | 9/2012 | Fay | G01B 9/0209 356/491 |

* cited by examiner

*Primary Examiner* — Jonathan Hansen
(74) *Attorney, Agent, or Firm* — Anova Law Group, PLLC

(57) ABSTRACT

System and method for measuring an aerial image are provided. The system may include a lighting unit for providing illuminating light to pass through a mask to form initial light. An imaging unit is configured for imaging the initial light to form imaging light. A beam splitting unit is for splitting the imaging light into projection light and reference light. A projection light is projected to a substrate to form a mask image in the substrate, and the substrate reflects the projection light to form first reflected light onto the beam splitting unit. A reflecting unit is for receiving the reference light to form second reflected light, and for projecting the second reflected light onto the beam splitting unit, the second reflected light and the first reflected light interfering with each other to form interference light. A measuring unit is for measuring an aerial image formed from the interference light.

20 Claims, 5 Drawing Sheets

MEASURING SYSTEM AND MEASURING METHOD

FIELD OF THE DISCLOSURE

The present disclosure generally relates to the field of semiconductor technology and, more particularly, relates to a system and method for measuring an aerial image.

BACKGROUND

With the development semiconductor technology, critical dimensions (CDs) of semiconductor devices become smaller and smaller, the integration degree of IC chips have become more sophisticated, and more stringent requirements are made for the semiconductor manufacturing processes. It is therefore desirable to reduce errors often occurred in every step during the semiconductor processes and to reduce device failure.

Photolithography process plays an important role in the semiconductor manufacturing processes. In a standard CMOS process, dozens of photolithography processes are needed. The photolithography processes, however, may be affected by resolution of photolithographic machine and alignment accuracy. Errors are often occurred in the photolithography processes.

In a photolithography process, scanning electron microscope (SEM) may be used to measure patterns formed in the substrate, by an etching process using a photoresist layer or other film layer as an etch mask. In an SEM measurement, an electron gun emits electron beams. The electron beams are then focused on surface of the pattern. High-energy electron beam thus interacts with the material of the pattern. A secondary electron collection generated on the pattern may be amplified and then sent to the gate of a picture tube to form various image features for observation.

However, it is not efficient when using an SME imaging measurement method for measuring a mask pattern.

BRIEF SUMMARY OF THE DISCLOSURE

According to various embodiments, there is provided a measuring system including a lighting unit, an imaging unit, a bean splitting unit, a reflecting unit, and/or a measuring unit. The lighting unit is configured for providing illuminating light to pass through a mask to form initial light. The imaging unit is configured for imaging the initial light to form imaging light. The beam splitting unit is configured for splitting the imaging light into projection light and reference light. The projection light is projected to a substrate to form a mask image in the substrate, and the substrate is configured for reflecting the projection light to form first reflected light onto the beam splitting unit. The reflecting unit is configured for receiving the reference light to form second reflected light, and for projecting the second reflected light onto the beam splitting unit, the second reflected light and the first reflected light interfering with each other to form interference light. The measuring unit is configured for measuring an aerial image formed from the interference light.

According to various embodiments, there is provided a method for measuring an aerial image of a substrate by providing illuminating light, wherein the illuminating light passes through the mask to form initial light; imaging the initial light to form imaging light; splitting the imaging light into projection light and reference light, wherein the projection light is projected to a substrate to form a mask image in the substrate, and the substrate is configured for reflecting the projection light to form first reflected light onto the beam splitting unit; reflecting the reference light to form second reflected light, the second reflected light and the first reflected light interfering with each other to form interference light; and measuring the aerial image formed from the interference light.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Current AIMS (i.e., aerial image measurement system) may be able to electronically image a given mask layer, but cannot be imaged on actual silicon wafer, especially when a multi-layer film is grown on the wafer or when patterns having high and low heights are formed on the wafer. This is because the multi-layer film and the high and low scattered patterns may scatter the incident light, and thus may affect aerial imaging of the mask images/patterns. Distortions and defects may occur to the aerial images.

As disclosed, a measuring system is provided. An exemplary measuring system may include a lighting unit, an imaging unit, a bean splitting unit, a reflecting unit, and/or a measuring unit.

The lighting unit is configured for providing illuminating light to pass through a mask to form initial light. The imaging unit is configured for imaging the initial light to form imaging light. The beam splitting unit is configured for splitting the imaging light into projection light and reference light. The projection light is projected to a substrate to form a mask image in the substrate, and the substrate is configured for reflecting the projection light to form first reflected light onto the beam splitting unit. The reflecting unit is configured for receiving the reference light to form second reflected light, and for projecting the second reflected light onto the beam splitting unit, the second reflected light and the first reflected light interfering with each other to form interference light. The measuring unit is configured for measuring an aerial image formed from the interference light.

Based on an optical interference and in a beam-splitting system, the initial light may pass through a mask and then be projected to a substrate to form a mask image on the substrate with a first portion of light reflected from the substrate to form a first reflected light. A second portion of light from the initial light may not be reflected from the substrate, but may be reflected directly by a reflecting unit to form a second reflected light. The first reflected light and the second reflected light may be interfered with each other to form an aerial image. The aerial image may be measured by a measuring unit. The measuring unit can measure images that are substantially the same in a same or single substrate. The measurement accuracy is then improved. The development step is avoided. The photolithography process development time and costs are saved.

For the above-mentioned objects, features and advantages of the present disclosure can be more fully understood with reference to the following specific embodiments of the present disclosure have described in detail.

Figure 1:
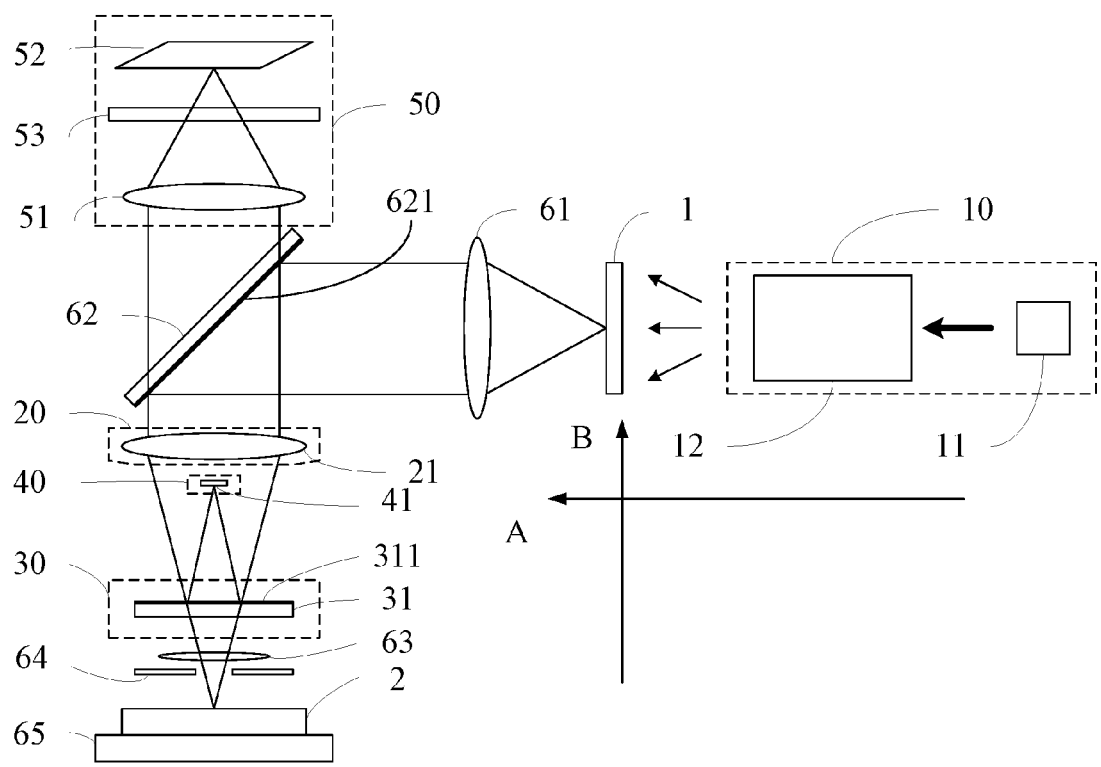
FIG. 1 illustrates an exemplary measuring system in consistent with various disclosed embodiments.
Figure 2:
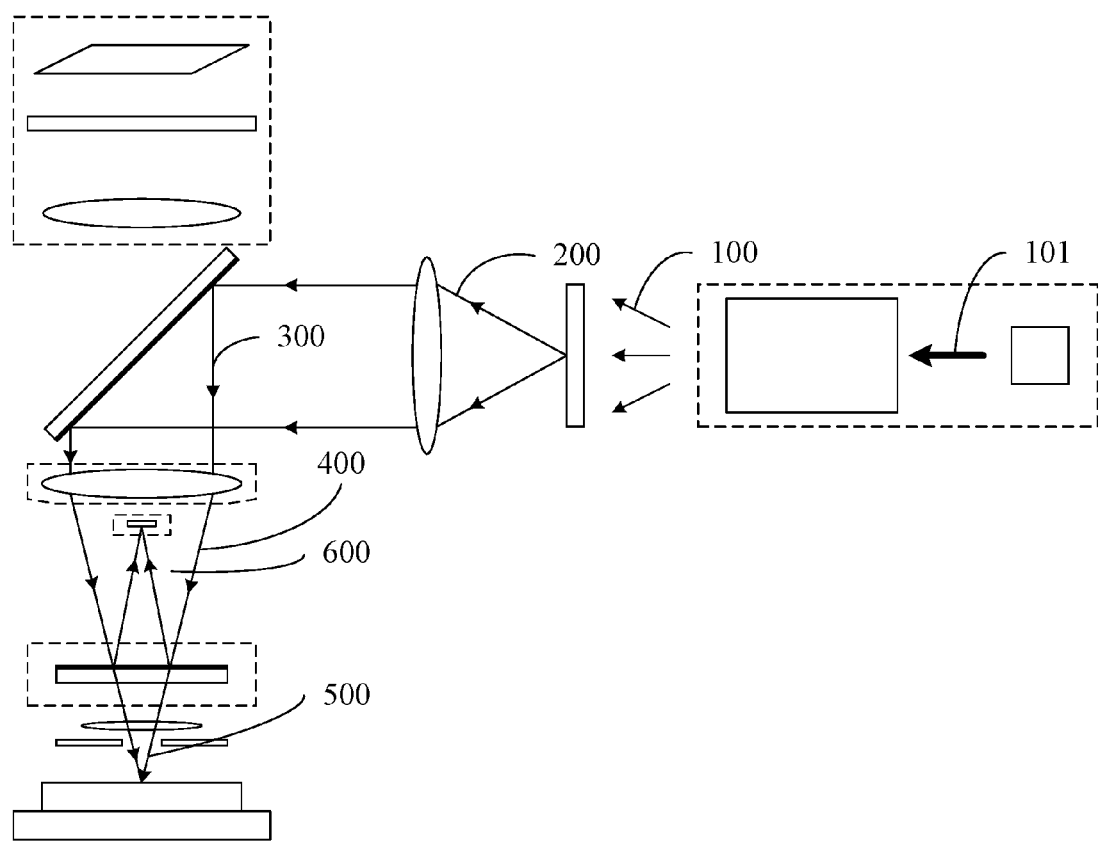
FIG. 2 illustrates an optical path according to the measuring system in FIG. 1 in consistent with various embodiments of present disclosure.

FIG. 1 illustrates an exemplary measuring system in consistent with various disclosed embodiments, and FIG. 2 illustrates an optical path according to the measuring system in FIG. 1.

In some embodiments, the exemplary measuring system is used to measure an aerial image formed in a silicon substrate according to a mask image carried in a mask. In other embodiments, the measuring system may be used to measure an aerial image formed on any substrate other than the silicon substrate.

Referring to FIGS. 1-2, the measuring system may include a lighting unit 10 configured to provide illuminating light 100. After passing through mask 1, the illuminating light 100 may form initial light 200.

For example, the lighting unit 10 may provide illuminating light 100 that is incident to mask 1 from various different angles. Therefore, the initial light 200 formed after passing through mask 1 may contain images (or patterns) in the mask 1.

In one embodiment, the lighting unit 10 may include a laser light source 11 and a lighting device 12.

For example, the laser light source 11 may be a photolithography exposure light source being used. That is, the laser wavelength of laser 101 outputted by the laser light source 11 may be the same laser wavelength that is used in the photolithography exposure. Therefore, under the same illuminating conditions, the aerial image subsequently measured by the measuring unit may be substantially the same as the actual image obtained from the exposure process on the photoresist layer.

Note that use of photolithography exposure light source as the light source in the disclosed lighting unit is for example only. Any suitable light source(s) may be used in accordance with various embodiments.

The lighting device 12 may process the laser 101 into illuminating light 100 that is incident on to the mask from various different angles. In one embodiment, the lighting device 12 may be a group of lens to scatter the laser 101 to form the illuminating light 100.

In various embodiments, the lighting device 12 can be used according to Kohler illumination principle, for example, to provide partially coherent illumination, ring illumination, and dipole illumination (or sometimes quadrupole illumination), although any suitable lighting device(s) may be used herein according to various embodiments of present disclosure.

Still in FIGS. 1-2, the measuring system may further include an imaging unit 20. The imaging unit 20 may be used to image the initial light 200 to form imaging light 400.

In one embodiment, between the imaging unit 20 and the mask 1, the measuring system may further include a first tube lens 61 and a first beam splitter 62. Note that, the first tube lens has an optical axis direction denoted as a first optical axis A.

For example, the first tube lens 61 may be used to condense the initial light 200, to improve intensity of the imaging light 400 subsequently formed by the imaging unit 20. This may increase quality of the subsequently formed aerial image.

The first beam splitter 62 is used to reflect the initial light 200 after being converged by the first tube lens 61 to form the incident light 300, projecting onto the imaging unit 20.

In one embodiment, the first beam splitter 62 may include a reflective surface 621. The reflective surface 621 and incident initial light 200 may form an angle of about 45°. Therefore, the incident light 300 formed due to reflection from the reflecting surface 621 may be perpendicular to the incident initial light 200 and may be projected to the imaging unit 20. Direction of the optical axis of the imaging unit 20 may is in a direction of a second optical axis B as shown in FIGS. 1-2. The second optical axis B and the first optical axis A are perpendicular to each other. Since the first beam splitter 62 may be subsequently further used for transmitting the interference light to the measuring unit 50. The optical axis of the measuring unit 50 may coincide with the second optical axis B. The first beam splitter 62 may be configured between the imaging unit 20 and the measuring unit 50. In this manner, length of the measuring system can be reduced.

The imaging unit 20 may be used to form the imaging light 400. In one embodiment, the imaging unit 20 may be used for imaging the incident light 300 reflected from the first beam splitter 62 to form the imaging light 400. The imaging light 400 is projected onto a beam splitting unit 30. The imaging unit 20 may include a microscopic lens 21 as an example, although any suitable imaging element(s) can be used herein to image the initial light to form the imaging light 400 without limitation.

Further, an imaging area of the aerial image measured by the measuring system is smaller than an imaging area obtained from an actual photolithography process. Microscopic lens may be used in the imaging unit 20 without using imaging lens conventionally used in a photolithographic machine or the like that has a huge volume/size and cost.

Still in FIGS. 1-2, the measuring system further includes a beam splitting unit 30. The beam splitting unit 30 is used to split the imaging light 400 into projection light 500 and reference light 600.

Figure 3:
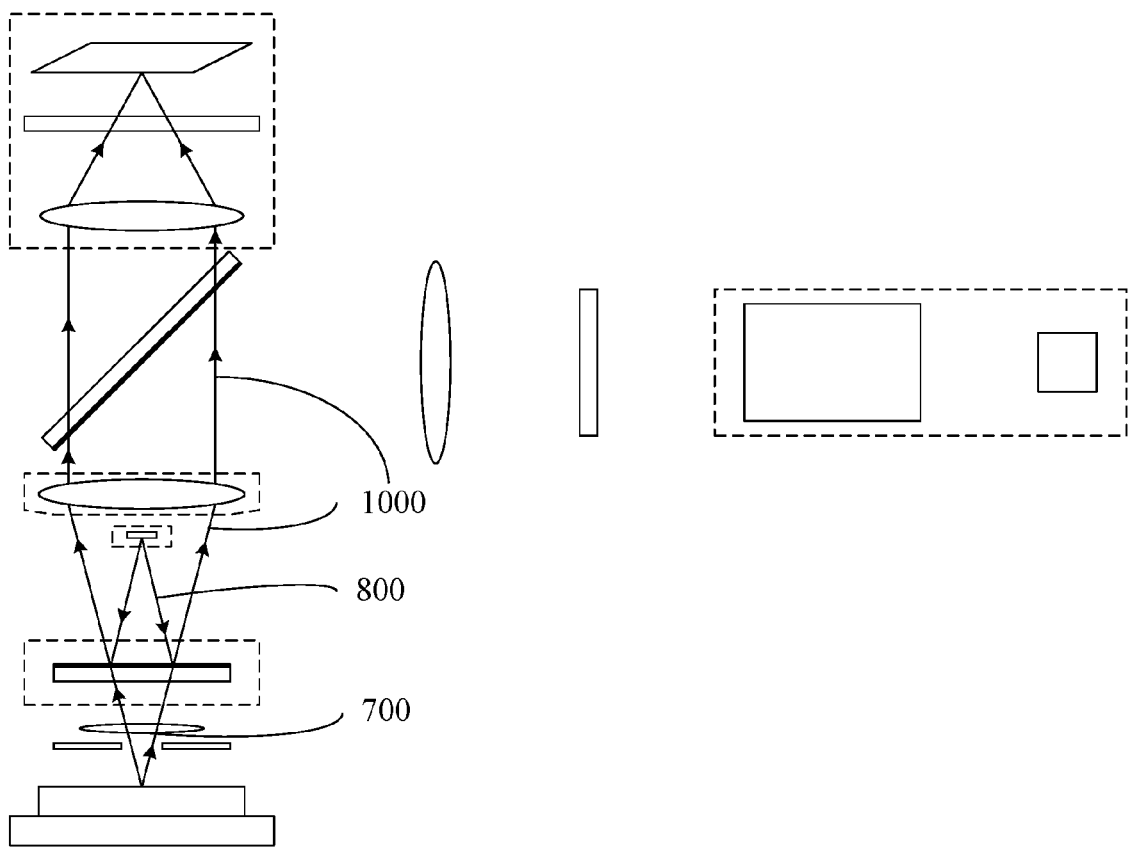
FIG. 3 illustrates imaging and optical measuring path of the measuring system in FIG. 1 in consistent with various embodiments of present disclosure.

FIG. 3 illustrates imaging and optical measuring path of the measuring system. For example, the projection light 500 is projected to a wafer 2 to form a mask image/pattern on wafer 2. The projection light 500 incident on the wafer 2 may be reflected on the surface of the wafer 2 to form a first reflected light 700, which is reflected to the beam splitting unit 30.

In some embodiments, the measuring system may also include a stage 65 for holding the wafer 2 thereon. In one embodiment, the stage 65 may be a movable platform that has six degrees of freedom to change the position of wafer 2. The six degrees of freedom includes lateral movement, along a direction of the second optical axis B, rotation movement around the second optical axis direction B and inclining movement along a direction perpendicular to the direction of the second optical axis B.

The beam splitting unit 30 may include a second beam splitter 31. The second beam splitter 31 may include a semi-reflector. As such, the imaging light 400 incident on the second beam splitter 31 may be split into the projection light 500 and the reference light 600. For example, the second beam plate 31 includes a reflective surface 311. The reflecting surface 311 may reflect a portion of the imaging light 400 to form a reference light 600 onto the reflecting unit 40. The second beam splitter 31 may transmit the rest portion of the imaging light 400 to form the projection light 500 projected onto the wafer 2 on the stage 65. The projection light 500 may be reflected by the wafer 2 to form a first reflected light 700 onto the second beam splitter 31 configured in the splitting unit 30.

In various embodiments, although a semi-reflector is used for the second beam splitter 31 to split the imaging light 400 into the projection light and reference light, any suitable beam splitter may be used herein for splitting the image light 400 into projection light and reference light without limitation in accordance with various embodiments.

Figure 4:
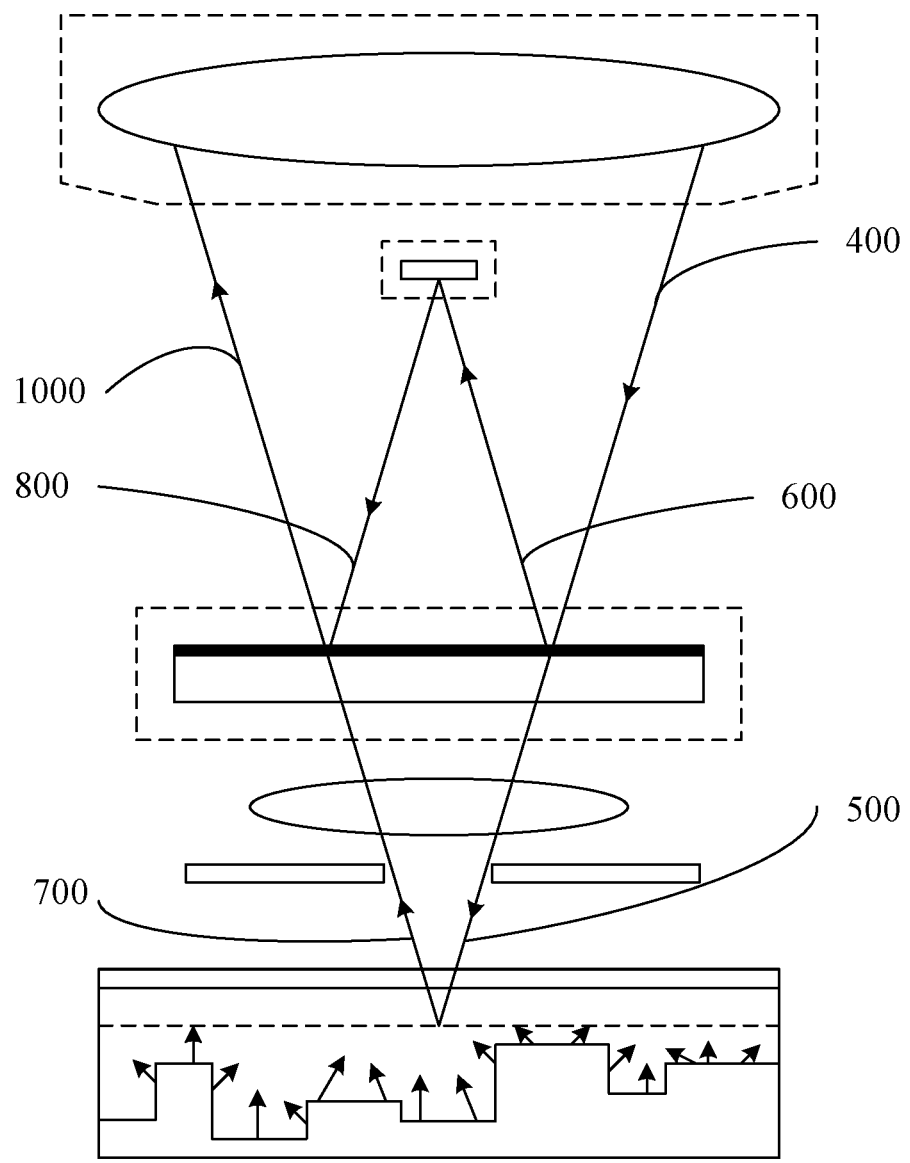
FIG. 4 illustrates an optical path in the measuring system of FIG. 1 in consistent with various embodiments of present disclosure.

In various embodiments, the wafer 2 may be a silicon wafer having a photoresist layer thereon. FIG. 4 illustrates optical path between the imaging unit 20, the beam splitting unit 30, the reflecting unit 40, and the wafer 2 in the measuring system of FIG. 1. As shown in FIG. 4, the lighting path, imaging path, and measuring path are illustrated or labeled. The projection light 500 is projected onto the wafer 2, images or patterns contained in the mask 1 may be formed on surface of the photoresist layer. Because multiple layers and/or high and low patterns may have already been formed on the wafer 2, the projection light 500 incident thereon may be scattered by these multiple layers and/or high and low patterns on wafer 2.

Optionally and additionally, the measuring system may include a compensation unit 63. The compensation unit 63 is located between the beam splitting unit 30 and the wafer 2 to compensate imaging aberration during the beam splitting process. For example, the compensation unit 63 may include an imaging aberration compensation lens. In one embodiment, a couple of beam splitting processes may be performed when forming projection light 500 from the initial light 200. The imaging aberration may be generated during these beam splitting processes. In order to make the formed photoresist pattern as close as possible to the image or patterns carried in the mask 1, the imaging aberration compensation lens can be configured on any suitable location in the optical path before the projection light 500 is projected onto the wafer 2 to compensate the imaging aberration during the beam splitting processes.

Still in FIG. 1 and referring to FIGS. 2-3, the measuring system also includes a reflecting unit 40, configured for receiving the reference light 600, so that the reference light 600 is reflected to form a second reflected light 800.

For example, the reflecting unit 40 may include a plane mirror 41, the mirror 41 and the second beam splitter 31 may be arranged in parallel, and the reflective surface of the plane mirror 41 may face the reflective surface of the second beam splitter 31. After the imaging light 400 is incident on the reflective surface 311 of second beam splitter 31, and a portion of imaging light 400 is reflected by the reflective surface 311 to form a reference light 600, which is then reflected by the plane mirror 41 to form a second reflected light 800. The second reflected light 800 is projected to the second beam splitter 31 in the beam splitting unit 30.

The second reflected light 800 and the first reflected light 700 are all projected onto the second beam splitter 31 in the beam splitting unit 30. The second reflected light 800 and the first reflected light 700 are interfered with each other to form an interference light 1000.

It should be noted, imaging of the interference light 1000 (generated by interfered first and second reflected light 700 and 800) and the actual imaging within the photoresist layer are substantially the same, because the image in the photoresist layer form the mask 1 is made by interferes of the projection light 500 incident from the top down and the scattered light from bottom up. On the other hand, the first reflected light 700 generated due to reflection of the projection light 500 on the wafer 2 is formed only by the scattered light scattered from the photoresist layer from bottom up, which does not include the projection light 500 incident from top down.

As such, if only imaged by the first reflected light 700, image obtained in the photoresist layer may not be a complete image according to the mask 1. Such image or pattern may be deformed or even missing. In addition, the second reflected light 800 may only be generated by reflection of the plane mirror 41 in the reflecting unit 20 but not be reflected by the wafer 2, and may thus be the same as the projection light 500. Therefore, interfere between the second reflected light 800 and the first reflected light 700, and interfere between the projection light 500 and the scattered light from the wafer 2 are substantially the same. As such, imaging of interference light 1000 and the actual imaging in the photoresist layer should be substantially the same.

To improve imaging quality, in one embodiment, a diaphragm 64 may be provided between the wafer 2 and the beam splitting unit 30 for blocking stray light.

Still in FIG. 1, in conjunction with FIG. 3, the measuring system also includes a measuring unit 50, configured for measuring an aerial image formed by the interference light 1000.

The wafer 2 reflects the projection light 500 to form the first reflected light 700 to the second beam splitter 31 in the beam splitting unit 30. The plane mirror 41 reflects the reference light 600 to form the second reflected light 800 projected to the second beam splitter 31 in the beam splitting unit 30. Thus, the second beam splitter 31 is also used to reflect the second reflected light 800 to the measuring unit 50, and to make the first reflected light 700 be projected to measuring unit 50.

For example, the measuring unit 50 may include a second tube lens 51 and an image sensor 52.

The second tube lens 51 can be used for converging the interference light 1000. The measuring unit 50 may measure the aerial image formed by the converged interference light 1000 converged by the second tube lens 51. By measuring the aerial image formed by the converged interference light 1000, quality of the aerial image is improved, measurement accuracy is increased, and the measurement difficulty is reduced.

The image sensor 52 may be used for collecting aerial image formed by the converged interference light 1000 converged by the second tube lens 51. For example, the image sensor 52 may be a charge coupled device (CCD) array, a complementary metal oxide semiconductor (CMOS) sensor array, and the like. For example, the image sensor 52 may be a UV-enhanced CCD array.

To improve imaging quality, a shutter 53 may be configured between the second tube lens 51 and the image sensor 52 to control exposure amount that the interference light 1000 projected on the image sensor 52.

Although the present disclosure is described primarily by using the disclosed measuring system for measuring aerial image formed in the wafer 2 corresponding to mask 1, the disclosed measuring system may be used to measure any other suitable imaging including, for example, imaging of small type mask used for research and development, and/or imaging of liquid crystal filter for image programming. Various masks and wafers may be included in the present disclosure without limitation.

In various embodiments, the measuring system used to measure imaging of the mask 1 in the wafer 2, may be used to confirm the design rules, may be used to confirm the image contrast, depth of focus, and other process window, and may be used to confirm the performance and quality of the mask.

In this manner, by an optical interference imaging method and based on optical interference, the present disclosure uses beam splitting system to project a portion of the initial light that passes through the mask to be projected onto the substrate to form a mask image in the substrate. A first reflected light is formed from the substrate. Other portion(s) of the initial light that are not reflected by the substrate may be directly, by the reflecting unit, reflected to form a second reflected light. The first reflected light and the second reflected light may interfere with each other to image. By using the measuring unit to image, measure, images that are actually same in a same substrate may be measured, whereby improving the measurement accuracy, and avoiding other steps such as conventional development steps, saving time and costs for developing the photolithography process.

Accordingly, the present disclosure also provides a measuring method for measuring an aerial image of a mask in a substrate.

The method may include: providing an illuminating light, the illuminating light passing through the mask to form an initial light; and imaging the initial light to form an imaging light. The imaging light is split into projection light and reference light. The projection light is transmitted to the substrate and form a mask image in the substrate. The projection light may be reflected by the substrate to form first reflected light. The reference light is reflected to form a second reflected light. The second reflected light and the first reflected light are beam combined and interfere with each other to form interference light. Aerial image formed from interference light is measured to measure the mask image in the substrate.

In various embodiments, the present measurement method for measuring aerial image of a mask in a wafer, the wafer may include a photoresist layer thereon.

Figure 5:
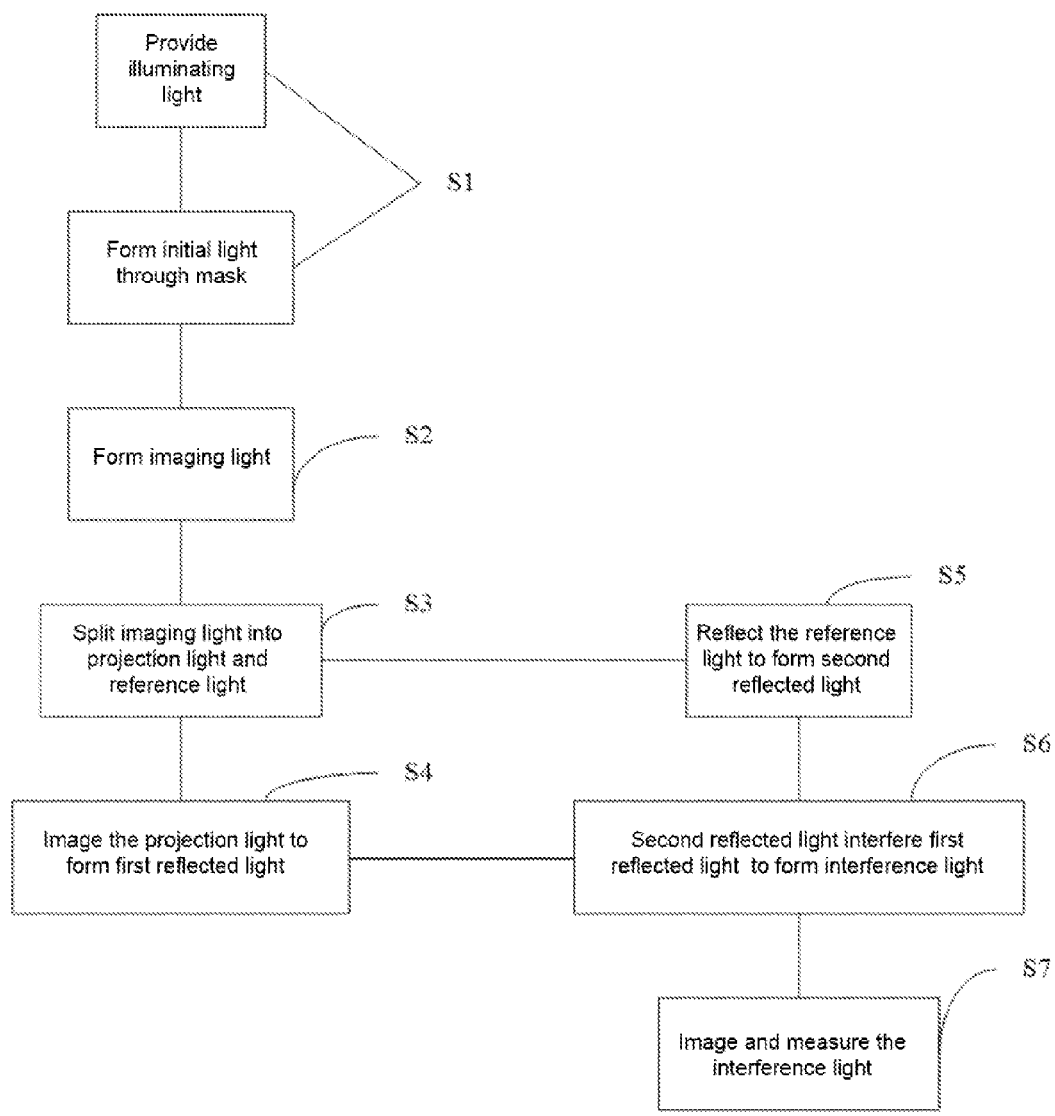
FIG. 5 illustrates an exemplary measuring method in consistent with various embodiments of present disclosure.

FIG. 5 illustrates an exemplary measuring method in consistent with various embodiments of present disclosure.

In Step S1, illuminating light is provided and incident from various different angles to a mask and to form initial light after the mask.

For example, the illuminating light may provide light source for the imaging in the disclosed measuring method. In one embodiment, a laser used for the exposure process in the photolithography may be used as the illuminating light. Therefore, under the same illuminating conditions, aerial image subsequently measured by the measuring unit may be the same image as from the actual exposure on the photoresist layer. Thus, the laser light may be scattered to form an illuminating light incident on the mask and become initial light after passing through the mask, including the mask image.

In Step S2, imaging light is formed by imaging the initial light.

Since the measured area according to the disclosed measuring method is smaller than that from the photolithography process, a microscopic lens can be used to image the initial light without using imaging lens used in a photolithographic machine or the like that has a huge volume/size and cost.

Note that, after forming the initial light and prior to imaging the initial light, the measuring method may further include condensing the initial light, thereby improving image quality.

In Step S3, the imaging light is split into projection light and reference light. For example, a semi-reflector is used to beam split the imaging light into the projection light and the reference light.

In Step S4, the projection light may be imaged in the wafer to form first reflected light. For example, the projection light may be projected onto a silicon wafer to form a mask image in the wafer. The wafer may reflect the projection light to form the first reflected light.

In one embodiment, the semi-reflector allows a portion of the imaging light to form projection light. The projection light is projected onto the silicon wafer to form the mask image in the photoresist surface on the wafer.

In one embodiment, a plurality of films and high and low patterns may have been formed in the wafer, which may scatter projection light incident thereon. The mask image formed in the photoresist layer is formed by interfere between the projection light incident from top down and the scattered light reflected from bottom up.

After the imaging light is split into projection light and reference light and before the projection light is projected to the wafer, the measuring method also includes imaging aberration compensation of the process of the projection light to remove imaging aberration generated due to beam splitting processes. In one embodiment, the use of imaging aberration compensation lens may compensate and remove the imaging aberration.

Still in FIG. 5, while the projection light is projected onto the wafer for imaging, Step S5 is performed, the reference light may be reflected to form a second reflected light. For example, the planar mirror may be used to reflect the reference light to form the second reflected light.

In Step S6, the second reflected light and the first reflected light are beam combined to interfere with each other to form interference light.

In order to improve the quality of the subsequent imaging and progress in measurement, after the first reflected light is formed and before first reflected light and the second reflected light are combined to interfere, the measuring method further includes: removing stray light from the first reflected light.

After two times of reflection, the second reflected light may be the same as the projection light incident to the wafer. Therefore, interfere between the second reflected light and first reflected light and interfere between the projection light and scattered light in the photoresist layer are the same. Therefore, the imaging of the interference light, and the actual imaging in the photoresist layer are substantially the same.

Still in FIG. 5, after forming the interference light, Step S7 may be performed to image and measure the interference light.

An image sensor may be used for imaging and measuring the interference light. For example, the image sensor may include a CCD array, a CMOS array or the like. In one embodiment, the image sensor is a UV-enhanced CCD array.

In one embodiment, a tube lens may be used to image the interference light to improve the image quality. And a speed device or a shutter may be configured before the image sensor to control exposure amount of the interference light on the CCD array to further improve imaging quality.

Although the present disclosure is described primarily by using the disclosed measuring method for measuring aerial image formed in the wafer 2 corresponding to mask 1, the disclosed measuring system may be used to measure any other suitable imaging including, for example, imaging of small type mask used for research and development, or imaging of liquid crystal filter for image programming.

Further, the measuring method used to measure imaging of the mask in the wafer may be used to confirm the design rules, may be used to confirm the image contrast, depth of focus, and other process window, and may be used to confirm the performance and quality of the mask.

In this manner, by an optical interference imaging method and based on optical interference, the present measuring method may use beam splitting system to split the initial light after the mask into two portions, one portion is projected onto the substrate to form a mask image in the substrate and to be reflected to form a first reflected light. The other portion(s) of the initial light that are not reflected by the substrate may be directly, by the reflecting unit, reflected to form a second reflected light. The first reflected light and the second reflected light may interfere with each other to image. By using the measuring unit to image, measure, same images in a same substrate may be measured, whereby improving the measurement accuracy, and avoiding other steps such as conventional developing process, saving time and costs for developing the photolithography process.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A measuring system, comprising:
   a lighting instrument, configured for providing illuminating light, wherein the illuminating light passes through a mask to form initial light;
   an imager, configured for imaging the initial light to form imaging light;
   a beam splitter, configured for splitting the imaging light into projection light and reference light, wherein the projection light is projected to a substrate to form an image of the mask in the substrate, and the substrate is configured for reflecting the projection light to form first reflected light onto the beam splitting unit;
   a reflector, configured for receiving the reference light to form second reflected light, and for projecting the second reflected light onto the beam splitter, the second reflected light and the first reflected light interfering with each other to form interference light; and
   a measuring device, configured for measuring an aerial image formed from the interference light, the aerial image formed from the interference light being substantially the same as the image of the mask through which the illuminating light passes.

2. The system according to claim 1, further including:
   a first tube lens, configured for converging the initial light, wherein the imager is configured for imaging the initial light that is converged by the first tube lens.

3. The system according to claim 2, further including:
   a first beam splitter, configured for reflecting the converged initial light to the imager and configured for projecting the interference light to the measuring device.

4. The system according to claim 1, wherein the beam splitter includes:
   a second beam splitter, configured for reflecting the second reflected light formed from the reflector onto the measuring device, and configured for transmitting the first reflected light from the substrate onto the measuring device.

5. The system according to claim 4, wherein the reflector includes:
   a plane mirror configured in parallel with the second beam splitter.

6. The system according to claim 1, further including:
   a compensation unit, situated between the beam splitter and the substrate, to compensate imaging aberration generated during the beam splitting process.

7. The system according to claim 1, further including:
   a diaphragm disposed in an optical path of the first reflected light for blocking stray light.

8. The system according to claim 1, wherein:
   the lighting instrument includes a laser source providing a wavelength a same as for an exposure process of a photolithographic machine.

9. The system according to claim 8, wherein:
   the lighting instrument further includes a lighting device, configured for processing parallel light generated by the laser source into the illuminating light incident on to the mask from different angles.

10. The system according to claim 9, wherein:
    the lighting device provides partially coherent illumination, ring illumination, dipole illumination or quadrupole illumination.

11. The system according to claim 1, wherein:
    the imager includes a microscopic lens.

12. The system according to claim 1, wherein the measuring device includes:
    a second tube lens, configured for converging the interference light; and
    an image sensor, configured for collecting the aerial image formed by the converged interference light converged by the second tube lens.

13. The system according to claim 1, wherein the measuring device further includes:
    a shutter configured between the second tube lens and the image sensor and used to control an exposure amount the interference light projected on the image sensor.

14. The system according to claim 13, wherein:
    the image sensor is a CCD array or CMOS sensor array.

15. The system according to claim 1, further including:
    a stage, configured for placing the substrate thereon, wherein the stage is a movable platform.

16. A method for measuring an aerial image of a substrate, comprising:
    providing illuminating light, wherein the illuminating light passes through the mask to form initial light;
    imaging the initial light to form imaging light;
    splitting the imaging light into projection light and reference light, wherein the projection light is projected to a substrate to form an image of the mask in the substrate, and the substrate is configured for reflecting the projection light to form first reflected light onto the beam splitting unit;

reflecting the reference light to form second reflected light, the second reflected light and the first reflected light interfering with each other to form interference light; and measuring the aerial image formed from the interference light, the aerial image formed from the interference light being substantially the same as the image of the mask through which the illuminating light passes.

17. The method according to claim 16, further including:
converging the initial light for imaging after forming the initial light and before imaging the initial light to form the imaging light.

18. The method according to claim 16, further including:
performing an imaging aberration compensation to the projection light to remove imaging aberration generated during the beam splitting process, after splitting the imaging light into the projection light and the reference light and before projecting the projection light onto the substrate.

19. The method according to claim 16, further including:
removing stray light from the first reflected light, after forming the first reflected light and before the first reflected light and the second reflected light are combined to interfere.

20. The method according to claim 16, wherein the step of providing the illuminating light includes:
providing the illuminating light having a wavelength a same as used in an exposure process of a photolithographic machine.

* * * * *